United States Patent
Oishi et al.

(10) Patent No.: US 8,291,369 B2
(45) Date of Patent: Oct. 16, 2012

(54) COMPUTER-READABLE RECORDING MEDIUM STORING VERIFICATION SUPPORT PROGRAM, VERIFICATION SUPPORT APPARATUS, AND VERIFICATION SUPPORT METHOD FOR SUPPORTING VERIFICATION OF HARDWARE SYSTEM DESIGN INCLUDING DIFFERENT HARDWARE MODELS

(75) Inventors: Ryosuke Oishi, Kawasaki (JP); Atsushi Ike, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 201 days.

(21) Appl. No.: 12/659,945

(22) Filed: Mar. 25, 2010

(65) Prior Publication Data

US 2010/0251193 A1  Sep. 30, 2010

(30) Foreign Application Priority Data

Mar. 27, 2009 (JP) .................................. 2009-80128

(51) Int. Cl.
*G06F 17/50* (2006.01)

(52) U.S. Cl. ........ 716/136; 716/100; 716/101; 716/102; 716/103; 716/104; 716/132; 703/13; 703/14; 703/23; 703/27; 703/28

(58) Field of Classification Search .......... 716/100–104, 716/132, 136; 703/13–14, 23, 27, 28
See application file for complete search history.

(56) References Cited

U.S. PATENT DOCUMENTS

| | | | | |
|---|---|---|---|---|
| 6,226,780 B1 * | 5/2001 | Bahra et al. | ................... | 716/102 |
| 6,631,470 B2 * | 10/2003 | Chang et al. | ................... | 716/103 |
| 6,651,038 B1 * | 11/2003 | Johns et al. | ..................... | 703/27 |
| 7,437,701 B1 * | 10/2008 | Dutra et al. | ................... | 716/104 |

FOREIGN PATENT DOCUMENTS

| | | |
|---|---|---|
| JP | 2005-525660 | 8/2005 |
| WO | WO 03/098491 A1 | 11/2003 |

* cited by examiner

*Primary Examiner* — Nghia Doan
(74) *Attorney, Agent, or Firm* — Staas & Halsey LLP

(57) ABSTRACT

A verification support apparatus and method are provided. The verification support apparatus executing a simulation controlling a communication between a first hardware model in communication with a bus model and adapted to the same first specifications as the bus model, and a second hardware model in communication with the bus model and adapted to second specifications differing from those of the bus model, the apparatus includes a reception unit that receives data based on the second specifications from the second hardware model, a conversion unit that, based on the first specifications, converts the data received by the reception unit into data adapted to the first specifications; and a transmission unit that transmits the data converted by the conversion unit, via the bus model, to a hardware model which is a transmission destination.

12 Claims, 16 Drawing Sheets

-RELATED ART-

```
                                                            ⸺1100
INPUT         ACLK;    // GLOBAL CLOCK
INPUT         ARESETN; // GLOBAL RESET

// WRITE ADDRESS CHANNEL
INPUT [7:0]   AWID;    // ADDRESS ID
INPUT [31:0]  AWADDR;  // ADDRESS BUS
INPUT [3:0]   AWLEN;   // TRANSFER LENGTH
INPUT [2:0]   AWSIZE;  // TRANSFER WIDTH
INPUT [1:0]   AWBURST; // BURST TYPE
INPUT [1:0]   AWLOCK;  // ATOMIC ACCESS INFORMATION
INPUT [3:0]   AWCACHE; // CACHEABLE/BUFFERABLE INFORMATION
INPUT [2:0]   AWPROT;  // PROTECTION INFORMATION
INPUT         AWVALID; // ADDRESS/CONTROL VALID HANDSHAKE
OUTPUT        AWREADY; // ADDRESS/CONTROL READY HANDSHAKE

// WRITE DATA CHANNEL
INPUT [31:0]  WDATA;   // WRITE DATA BUS
INPUT [15:0]  WSTRB;   // WRITE DATA BYTE LANE STROBES
INPUT         WLAST;   // INDICATS LAST TRANSFER IN WRITE BURST
INPUT         WVALID;  // WRITE DATA VALID HANDSHAKE
OUTPUT        WREADY;  // WRITE DATA READY HANDSHAKE

// BUFFERED RESPONSE (WRITE COMPLETION) CHANNEL
OUTPUT [7:0]  BID;     // BUFFERED RESPONSE ID
OUTPUT [1:0]  BRESP;   // BUFFERED WRITE RESPONSE
OUTPUT        BVALID;  // BUFFERED RESPONSE VALID HANDSHAKE
INPUT         BREADY;  // BUFFERED RESPONSE READY HANDSHAKE

// READ ADDRESS CHANNEL
INPUT [7:0]   ARID;    // ADDRESS ID
INPUT [31:0]  ARADDR;  // ADDRESS BUS
INPUT [3:0]   ARLEN;   // TRANSFER LENGTH
INPUT [2:0]   ARSIZE;  // TRANSFER WIDTH
INPUT [1:0]   ARBURST; // BURST TYPE
INPUT [1:0]   ARLOCK;  // ATOMIC ACCESS INFORMATION
INPUT [3:0]   ARCACHE; // CACHEABLE/BUFFERABLE INFORMATION
INPUT [2:0]   ARPROT;  // PROTECTION INFORMATION
INPUT         ARVALID; // ADDRESS/CONTROL VALID HANDSHAKE
OUTPUT        ARREADY; // ADDRESS/CONTROL READY HANDSHAKE

// READ DATA CHANNEL
OUTPUT [7:0]  RID;     // READ ID
OUTPUT [31:0] RDATA;   // READ DATA BUS
OUTPUT [1:0]  RRESP;   // READ RESPONSE
OUTPUT        RLAST;   // INDICATS LAST TRANSFER IN READ BURST
OUTPUT        RVALID;  // READ DATA VALID HANDSHAKE
INPUT         RREADY;  // READ DATA READY HANDSHAKE
``` ated system 10.

COMPUTER-READABLE RECORDING MEDIUM STORING VERIFICATION SUPPORT PROGRAM, VERIFICATION SUPPORT APPARATUS, AND VERIFICATION SUPPORT METHOD FOR SUPPORTING VERIFICATION OF HARDWARE SYSTEM DESIGN INCLUDING DIFFERENT HARDWARE MODELS

CROSS-REFERENCE TO RELATED APPLICATION(S)

This application is related to and claims priority to Japanese Patent Application No. 2009-080128, filed on Mar. 27, 2009, and incorporated herein by reference.

BACKGROUND

1. Field

The embodiments discussed herein are directed to a computer-readable recording medium storing a verification support program, verification support apparatus, and verification support method for supporting a verification of a system hardware design.

2. Description of the Related Art

Heretofore, when designing a new system using a semiconductor integrated circuit, a verification process estimating a power consumption and processing performance (a processing time until a desired operation is completed) of the whole system when causing the designed system to perform the desired operation may be needed at a stage before shifting to the manufacture of the actual device. In the verification process, the designer determines whether the design details are appropriate. Also, by the designer referring to a verification result and modifying the design details as necessary, a reduction of power consumption and improvement of processing performance is possible, and it is possible to respond to the needs of a user.

In the verification process, conventionally, for estimating the power consumption and processing performance of the whole system, generally, a simulation of a verification subject system operation, using a system model wherein a system which is a verification subject is realized by software, is known.

FIG. 1 illustrates a configuration example of a verification subject system. When simulating an operation of the verification subject system 10, it is necessary to prepare a system model of the verification subject system 10. A mutual connection condition of each item of hardware (for example, a CPU, a memory, and a module A) in the verification subject system 10, and implementation information of each item of hardware, may be included in the system model. Then, a power consumption and processing performance when executing a simulation of the verification subject system 10 are provided as estimate values of the verification subject system 10.

Also, heretofore, a degree of detail of a register transfer level (RTL) description level or greater is required for the implementation information of each item of hardware. However, a simulation with implementation information of a transfer level (TL) description level, with a degree of detail lower than that of the RTL, has also become possible. Furthermore, a simulation with a coordinated simulation (Co-SIM) is possible, even in the case of implementation information in which the RTL description and TL description are mixed. (JP-T-2005-525660).

To execute a simulation of the verification subject system, it is sufficient to prepare implementation information of each item of hardware. Among the items of hardware, it is comparatively easy to prepare implementation information for a highly versatile CPU, memory, or the like, as there are many opportunities for design, and it may also be possible to divert implementation information designed for another system.

An item of hardware such as the module A of the verification subject system 10, which is newly designed and is intended for a highly specialized process, may need longer to prepare the implementation information in comparison with the CPU and memory. When executing a simulation of the whole system, a simulation scenario such as the one below is provided:

"Scenario example" CPU (write transaction to module A)
WriteAddress(address)//write request to module A
WriteData(a)//transmit write data a
WaitAck//wait for response from module A
. . . (the following omitted) module A (receives write request from CPU)
GetAddress(address)//wait for address request
. . . (the following omitted)

As in the above scenario example, in order for the CPU to carry out an appropriate operation in accordance with the scenario, it has to receive a response from the module A. That is, an implementation of all of the hardware in the verification subject system 10, including the module A, is essential for a simulation of the whole of the system. Consequently, in the event that the development of the implementation information of any item of hardware is delayed, the delayed development process becomes a bottleneck when executing a simulation of the whole of the system.

Furthermore, at the system design place, the kind of situation also occurs wherein various kinds of specification, such as those of a communication protocol, are changed at short notice after the implementation information of each item of hardware is prepared. FIG. 2 illustrates a problem accompanying a change in the protocol of the verification subject system. The verification subject system (existing system) 10, designed based on Advanced High-performance Bus (AHB) specifications, is represented on the left side of FIG. 2. Then, an updated system 20, in which the communication protocol is changed to Advanced eXtensible Interface (AXI) specifications, is represented on the right side of FIG. 2. With the updated system 20, it is taken that implementation information to which the AXI specifications are applied is prepared for the highly versatile items of hardware such as the CPU and memory, excluding the module A.

Also, an operation of the module A when the module A is accessed from the CPU is illustrated under each system. In the case of the updated system 20, the module A, based on the AXI specifications, has to newly output a response 21 (Response 1) in response to an access signal (WriteAddress) from the CPU. Actually, the module A being unable to output the response 21 because it has not been changed to the AXI specifications, the simulation in the updated system 20 experiences a breakdown.

Countermeasures have been discussed for the problem of eliminating the trouble with the simulation accompanying the specifications change with which the module implementation information does not keep pace. For example, in an e event that the implementation information of one portion of the hardware in the verification subject system 10 does not keep pace, an empty pseudo model which does not include implementation information is connected in place of the module A, in order to execute an early simulation of the whole of the system.

Conventionally, in the event that the specifications are changed as in FIG. 2, a bridge for converting the module A communication protocol is prepared. FIG. 3 illustrates an exemplary of a protocol conversion using a bridge insertion. As in FIG. 3, by connecting a bridge between the bus with the AXI specifications and the module A, a simulation of the whole of the updated system 20 is possible without preparing a module A with the AXI specifications.

SUMMARY

In an aspect of the embodiments discussed herein provide a verification support apparatus and method.

The above aspects can be attained by an apparatus and method executing a simulation controlling a communication between a first hardware model in communication with a bus model and adapted to the same first specifications as the bus model, and a second hardware model in communication with the bus model and adapted to second specifications differing from those of the bus model, the apparatus includes a reception unit that receives data based on the second specifications from the second hardware model a conversion unit that, based on the first specifications, converts the data received by the reception unit into data adapted to the first specifications; and a transmission unit that transmits the data converted by the conversion unit, via the bus model, to a hardware model which is a transmission destination.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 14 illustrates exemplary AXI bus port information;

DETAILED DESCRIPTION OF THE EMBODIMENTS

When a pseudo model is connected instead of the module A, no evaluation of the module A may be reflected in a simulation execution result because no implementation information is included in the model. That is, there may bead problem in that, even though a simulation may be executed, the accuracy of an estimate value is not acceptable.

Figure 3:
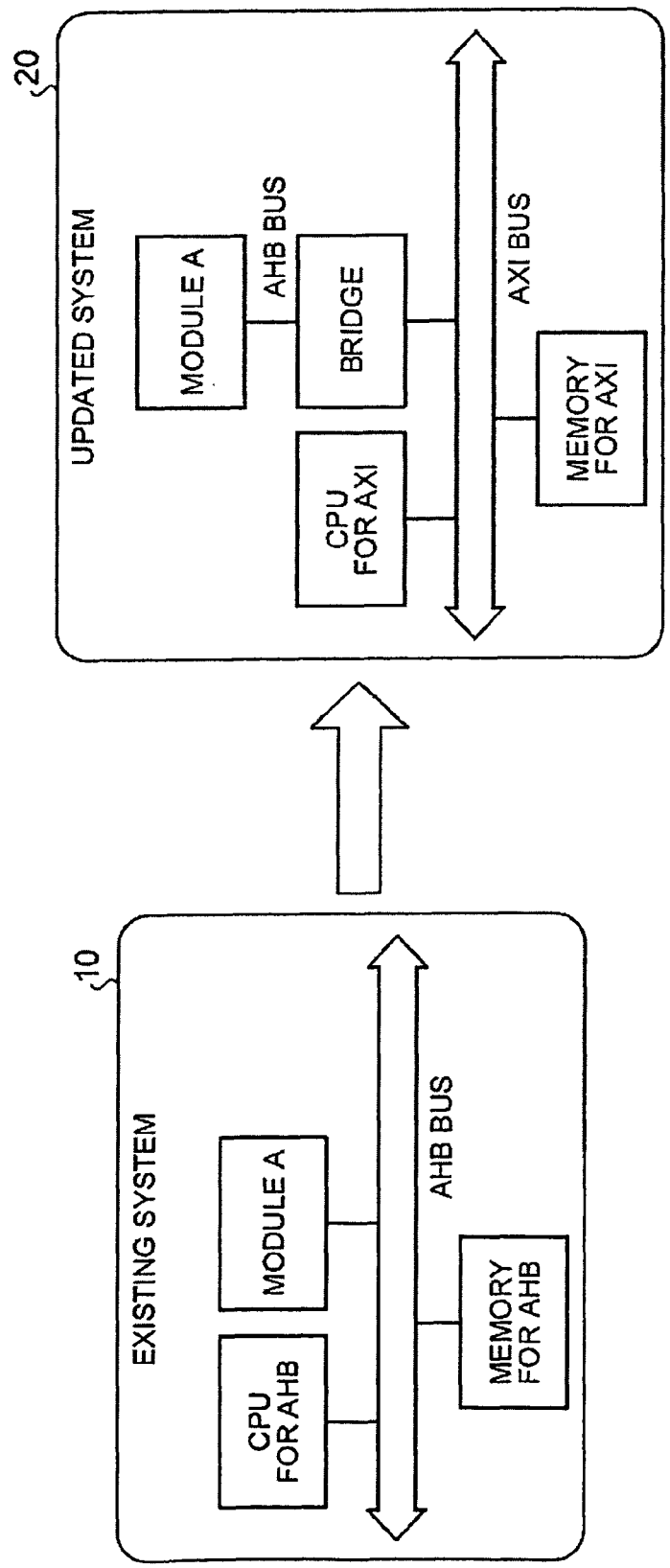
FIG. 3 illustrates an exemplary a protocol conversion using a bridge insertion.

Also, when a bridge is prepared, as in FIG. 3, it may be supposed that the same amount of time is needed in order to actually prepare bridge implementation information as to design the module A. Accordingly, there may be a problem in that, the result being that it is the same as waiting for the development of a module A to which the AXI specifications of the updated system 20 are applied, it creates a bottleneck when executing a simulation of the whole of the system.

A provision of a verification support program, verification support device, and verification support method which, in order to eliminate the heretofore described problem areas, enable an estimation of the power and performance when operating the whole of the system, even at the kind of early stage of the system design at which no module implementation information is prepared inside the system.

At a e time of an execution of a simulation of a system which is the subject of a verification, on an output of data to be transmitted from one item of hardware to another item of hardware with differing bus specifications, a conversion process is carried out on the data in order to adapt them to the specifications of the bus in the system.

Figure 4:
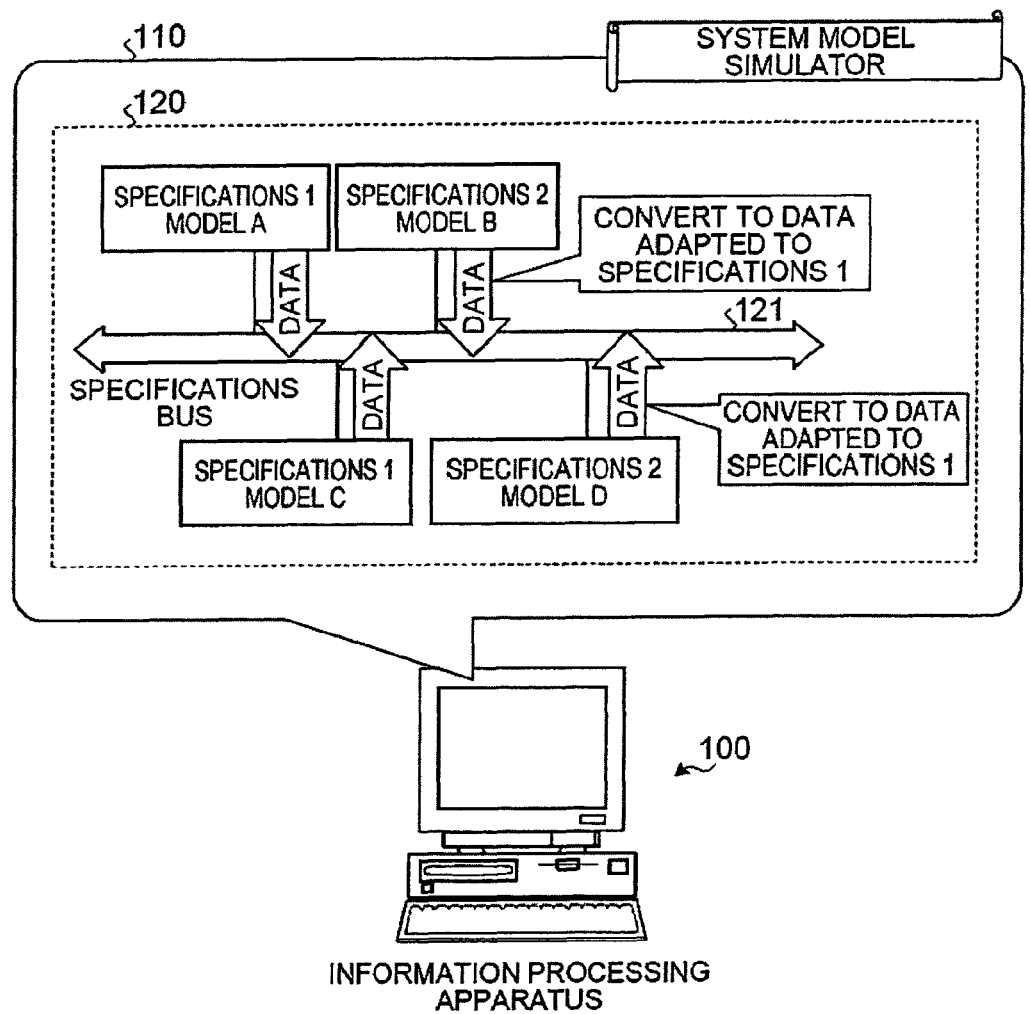
FIG. 4 illustrates a verification support process according to an embodiment.

FIG. 4 illustrates an exemplary verification support process.

A system model simulator 110, which executes a simulation of a system model 120 reproduced by software of a verification subject system, may be configured by an information processing apparatus 100. By executing a simulation of the system model 120 with the system model simulator 110, it is possible to estimate the power consumption and processing performance when actually executing the system at a design stage of the verification subject system.

In a verification support process according to an exemplary embodiment, it is possible to execute a simulation of the whole of the system model 120, even in the event that hardware items of differing specifications are mixed inside the system model 120. In the case of the system model 120 of FIG. 4 too, a simulation may be executed in a condition in which are mixed a model A and model C, with implementation information with specifications 1, the same as the specifications of a bus model 121, and a model B and model D, with implementation information with specifications 2 differing from the specifications of the bus model 121.

With the system model simulator 110, an operation of the models A and C configured of the implementation information of the specifications 1 is such that a simulation may be executed based on the implementation information as it is. An operation of the models B and D configured of the implementation information of the specifications 2 is such that a specific process is carried out at a time of a data transmission process.

For example, when data are transmitted from any model (A to D) to any other model, as in FIG. 4, data transmitted from the model B and model D with the specifications 2 are compiled based on the implementation information with the specifications 2. The system model simulator 110 converts data output from the model B and model D to the bus model 121 into data adapted to the same specifications 1 as the bus model 121.

In this way, the data transmitted from the models configured of the implementation information with the specifications 2 pass through the bus model 121 in a condition in which they are converted into data adapted to the specifications 1, and are output to the model which is the transmission destination. Then, each model may receive data via the bus model 121 regardless of the specifications. Even in the event that the specifications of the model which is the transmission destination do not reflect the specifications of the bus model 121, it is possible to receive the data with the specifications 1.

In the event that the model which receives the data transmitted from the model D is the model A or model C with the specifications 1, on data responding to the received data being output, the data are transmitted as they are, via the bus model 121, to the model which is the transmission destination. Then, in the event that the model which receives the data transmitted from the model D is the model B with the specifications 2, on data responding to the received data being output, they are output to the bus model 121 after being converted into data adapted to the specifications 1, in the same way as those of the model D.

In this way, by using the verification support process according to the embodiment, it is possible, even in the event that the hardware model inside the verification subject system is only partly developed, or that the bus specifications have been changed, to execute a simulation without waiting for the development of the hardware model. Furthermore, in the event too that, when the bus specifications differ, it is wished to simulate what kind of operation will take place for each of them, it is also possible to execute a simulation wherein hardware model implementation information is flexibly interchanged. Then, using the result of the simulation, it is possible to obtain an estimate value for verifying the whole of the system.

Figure 5:
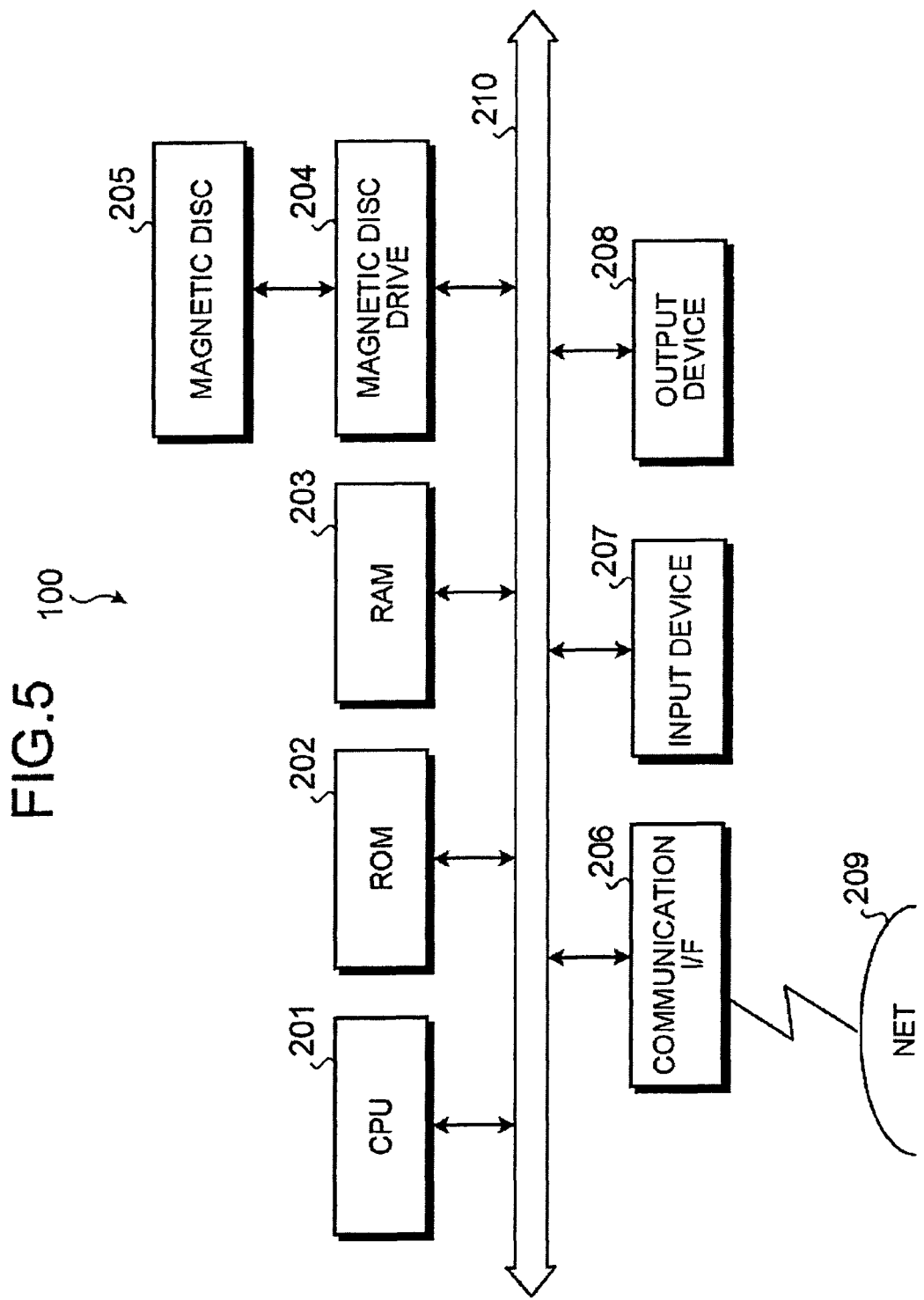
FIG. 5 illustrates a hardware configuration of an information processing apparatus.

FIG. 5 illustrates a information processing apparatus 100. In FIG. 5, the information processing apparatus 100 includes a central processing unit (CPU) 201, a read-only memory (ROM) 202, a random access memory (RAM) 203, a magnetic disc drive 204, a magnetic disc 205, a communication interface (I/F) 206, an input device 207, and an output device 208. Also, the components may be mutually connected by a bus 210.

the CPU 201 manages a control of the whole of the information processing apparatus 100. The ROM 202 stores various kinds of program, such as a boot program, and a verification support program for realizing the verification support process according to the embodiment. The RAM 203 is used as a work area of the CPU 201. The magnetic disc drive 204 controls an update of, and reference to, data on the magnetic disc 205 in accordance with a control of the CPU 201. The magnetic disc 205 stores data written thereon by a control of the magnetic disc drive 204. In the hardware configuration of FIG. 5, the magnetic disc 205 is used as a recording medium, but it is also acceptable to use another recording medium, such as an optical disc or flash memory.

The communication I/F 206, being connected via a communication line to a network (NET) 209 such as a local area network (LAN), a wide area network (WAN), or the internet, is connected to another information processing apparatus 100, or other external apparatus, via the network 209. Then, the communication I/F 206, managing the network 209 and an internal interface, controls an input and output of data from an external apparatus. As a configuration example of the communication I/F 206, it is possible to employ, for example, a modem or a LAN adaptor.

The input device 207 receives an input to the information processing apparatus 100 from an external apparatus. As the input device 207, a keyboard, a mouse, and the like are included. According to the kind of information processing apparatus 100 illustrated in FIG. 5, it is acceptable that an application which carries out a simulation is stored in advance in a storage area such as the ROM 202, RAM 203, or magnetic disc 205, but it is also acceptable that it is input from the input device 207, and stored in the heretofore mentioned storage area.

In the case of a keyboard, it may include, for example, keys for inputting characters, numerals, and various kinds of instruction, and carries out an input of data. Also, it is also acceptable that it is a touch panel type of input pad, a numeric keypad, or the like. In the case of a mouse, it carries out, for example, a cursor movement, a range selection, or a movement or change in size of a window. Also, provided that it may include a pointing device in the same way, it is also acceptable that the input device 207 is a trackball, a joystick, or the like.

The output device 208 outputs data disposed in the information processing apparatus 100, a simulation execution result, and the like. As the output device 208, a display, a printer, and the like, are included.

In the case of a display, for example, as well as a cursor, an icon, or a toolbox, data of a document, an image, or function information may be displayed. As the display, furthermore, a CRT, a TFT liquid crystal display, a plasma display, or the like, may be employed. In the case of a printer, for example, image data or document data may be printed. Furthermore, a laser printer or ink jet printer may be employed.

In the information processing apparatus 100, a simulation may be executed which controls a communication between hardware models (for example, the models A and C of FIG. 4) adapted to the specifications 1 of the bus model 121, and hardware models (for example, the models B and D of FIG. 4) adapted to the differing specifications 2, all connected to the bus model 121. The simulation, itself, of the system model 120 may use various conventional technologies.

The information processing apparatus 100 controls on the system model 120 occurring due to a simulation execution, a process when data are transmitted from a hardware model to which the specifications 2 are applied. Consequently, a description will be given hereafter of an exemplary information processing apparatus 100, modules relating to the process when data are transmitted from a hardware model to which the specifications 2 are applied.

Figure 6:
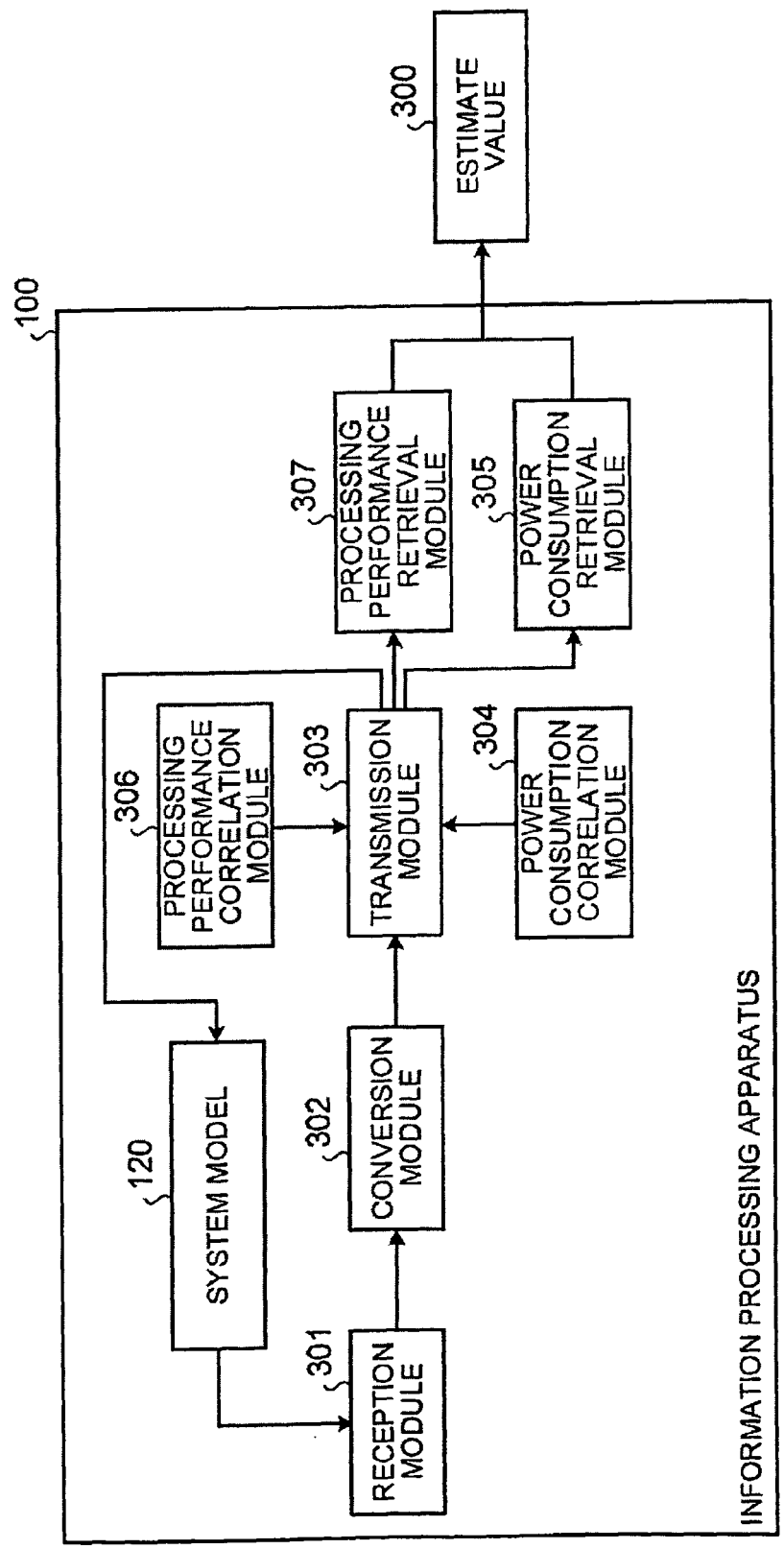
FIG. 6 illustrates an exemplary information processing apparatus.

FIG. 6 illustrates an exemplary configuration of the information processing apparatus. As in FIG. 6, the information processing apparatus 100 includes a reception module 301, a conversion module 302, a transmission module 303, a power consumption correlation module 304, a power consumption retrieval module 305, a processing performance correlation module 306, and a processing performance retrieval module 307 as modules. The modules (the reception module 301 to the processing performance retrieval module 307) which form a control module, realize their operations by, for example, causing the CPU 201 to execute a verification support program stored in a storage area of the ROM 202, RAM 203, or magnetic disc 205 illustrated in FIG. 5, or the like, or by with the communication I/F 206.

Figure 1:
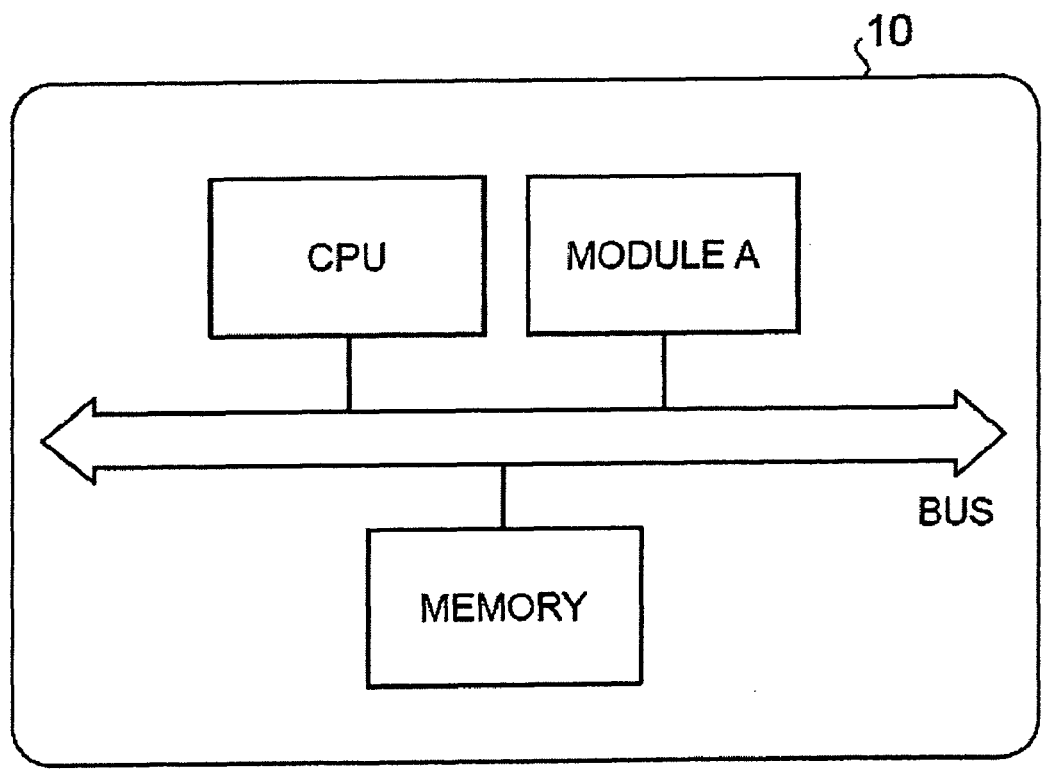
FIG. 1 illustrates a configuration example of a verification subject system.
Figure 2:
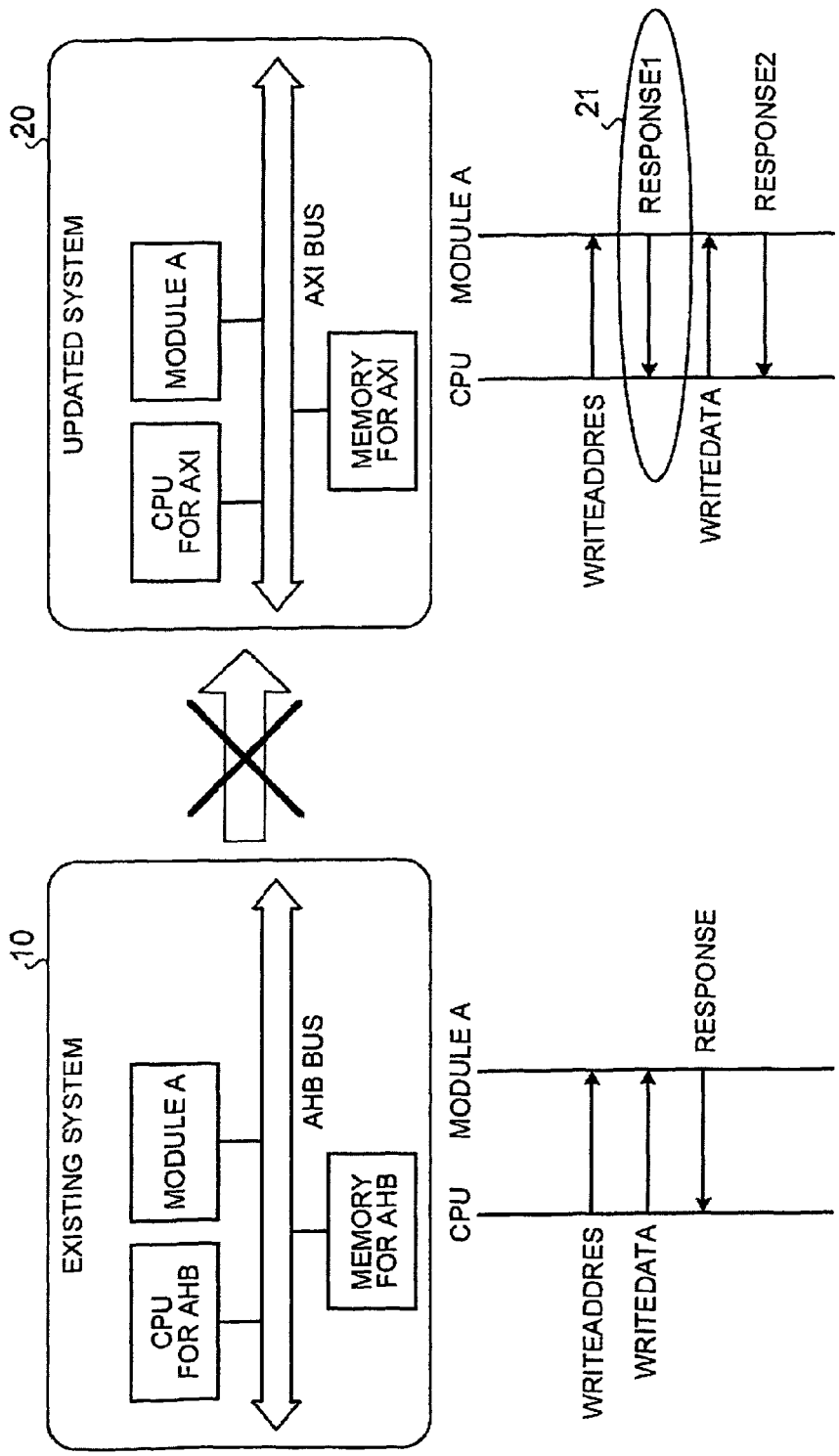
FIG. 2 illustrates a problem accompanying a change in protocol of the verification support system.

The reception module 301, when a simulation of the verification subject system may be executed by the system model 120, may receive data output from a hardware model with the specifications 2 differing from the specifications of the bus model 121. Also, the received data are stored in a storage area of the RAM 203, magnetic disc 205, or the like. As the data output from the hardware model with the specifications 2 are data based on the specifications 2, as things stand, there is a possibility of causing the kind of problem illustrated in FIG. 2 because of the difference in specifications with the bus model 121. Consequently, the received data are output to the conversion module 302 for a conversion process, to be described hereafter, to be performed.

The reception module 301 may receive all data transmitted from an optional hardware model whose specifications are not specified, despite their being transmitted data from a hardware model with the specifications 2. In the case of this kind of configuration, the reception module 301, furthermore, is capable of determining whether or not the specifications of the received data match the specifications 1. Then, the reception module 301 outputs the received data to the conversion module 302, to be described hereafter, only in the event that the specifications of the received data do not match the specifications 1.

In this way, by providing the reception module 301, it is possible to receive data output from a hardware model with the specifications 2, or all the data output from the hardware models in the system model 120. Consequently, as data adapted to the specifications 2 are not output to the bus model 121 with the specifications 1, it is possible to prevent a breakdown of a simulation due to data adapted to the specifications 2 being input into a hardware model with the specifications 1.

The conversion module 302, based on the specifications 1, converts data received by the reception module 301 into data adapted to the specifications 1. In order to convert them to data adapted to the specifications 1, for example, the conversion module 302 uses a method, to be described hereafter, of converting the received data into data adapted to the specifications 1 in accordance with transaction definitions provided in advance as the specifications 1. The converted data are stored in a storage area of the RAM 203, magnetic disc 205, or the like.

In this way, by providing the conversion module 302, data which are not adapted to the system model 120 bus specifications (the specifications 1) are automatically converted into data adapted to the specifications 1. That is, this means that even in the event that the data are data which are not adapted to the bus specifications, they are utilized as data which operate correctly in the system model 120.

Also, data which are once output from a hardware model, after being received by the reception module 301, undergo a conversion by the conversion module 302. That is, when carrying out the verification support process, there does not occur the kind of processing burden wherein the designer carries out an individual correction on the hardware model itself. Consequently, the designer, not being pressed with the development of a temporary hardware model for simulation purposes, may concentrate on the design of a hardware model adapted to the specifications 1.

The transmission module 303 is capable of transmitting data converted by the conversion module 302 to a hardware model which is a transmission destination, via the bus model 121. The data transmitted by the transmission module 303 are stored in a storage area of the RAM 203, magnetic disc 205, or the like.

The power consumption correlation module 304 is capable of correlating to a data transmission process by the transmission module 303 a power consumption arising when the transmission process may be executed, in the power consumption correlation module 304, a preset power consumption value is correlated as power consumption information to a transmission process which transmits data converted by the conversion module 302 to a hardware model which is a transmission destination.

The power consumption value set in the power consumption correlation module 304 is a power consumption value in the event of actually operating a hardware model with the specifications 1. As the power consumption value, it is acceptable to prepare the value in the event of actually operating, while a verification value is also acceptable. Information correlated by the power consumption correlation module 304 is stored in a storage area of the RAM 203, magnetic disc 205, or the like.

The power consumption retrieval module 305 is capable of retrieving power consumption information correlated by the power consumption correlation module 304 on a simulation relating to a data transmission process being executed in the system model 120. That is, a simulation relating to a transmission process means a process wherein data converted so as to be adapted to the specifications 1 are transmitted by the transmission module 303 to the bus model 121. Consequently, when a simulation of a transmission process may be executed, power consumption information correlated by the power consumption correlation module 304 is output as an estimate value 300. The retrieved power consumption value is stored in a storage area of the RAM 203, magnetic disc 205, or the like.

The processing performance correlation module 306 is capable of correlating to a data transmission process by the transmission module 303 a processing time taken when the transmission process may be executed. In the processing performance correlation module 306, a preset processing time is correlated as processing performance information to a data transmission process, in the same way as with the power consumption correlation module 304. The processing time set here being a processing time in the event of operating hardware with the specifications 1, it is acceptable that it is a value in the event of actually operating, or that it is a verification value. Information correlated by the processing performance correlation module 306 is stored in a storage area of the RAM 203, magnetic disc 205, or the like.

The processing performance retrieval module 307 is capable of retrieving processing performance information correlated by the processing performance correlation module 306 on a simulation relating to a data transmission process being executed in the system model 120. Consequently, when a simulation of a transmission process may be executed, processing performance information correlated by the processing performance correlation module 306 is output as the estimate value 300. The retrieved processing time is stored in a storage area of the RAM 203, magnetic disc 205, or the like.

In this way, by providing the power consumption correlation module 304, power consumption retrieval module 305, processing performance correlation module 306, and processing performance retrieval module 307, it is possible to increase the accuracy of a simulation by the information processing apparatus 100. With the system model 120, essentially, a condition is such that although wishing to use a hardware model with the specifications 1, it not being possible to prepare one, a hardware model with the specifications 2 is used.

T with the information processing apparatus 100, a power consumption value and processing time in the event of transmitting data with a hardware model adapted to the specifications 1 are set by the power consumption correlation module 304 and processing performance correlation module 306. As a result, it is possible to obtain estimate values 300 close to an actual operation, despite substituting with a hardware model which is not actually adapted to the specifications 1. Consequently, with the information processing apparatus 100, a highly accurate simulation may be executed.

Figure 7:
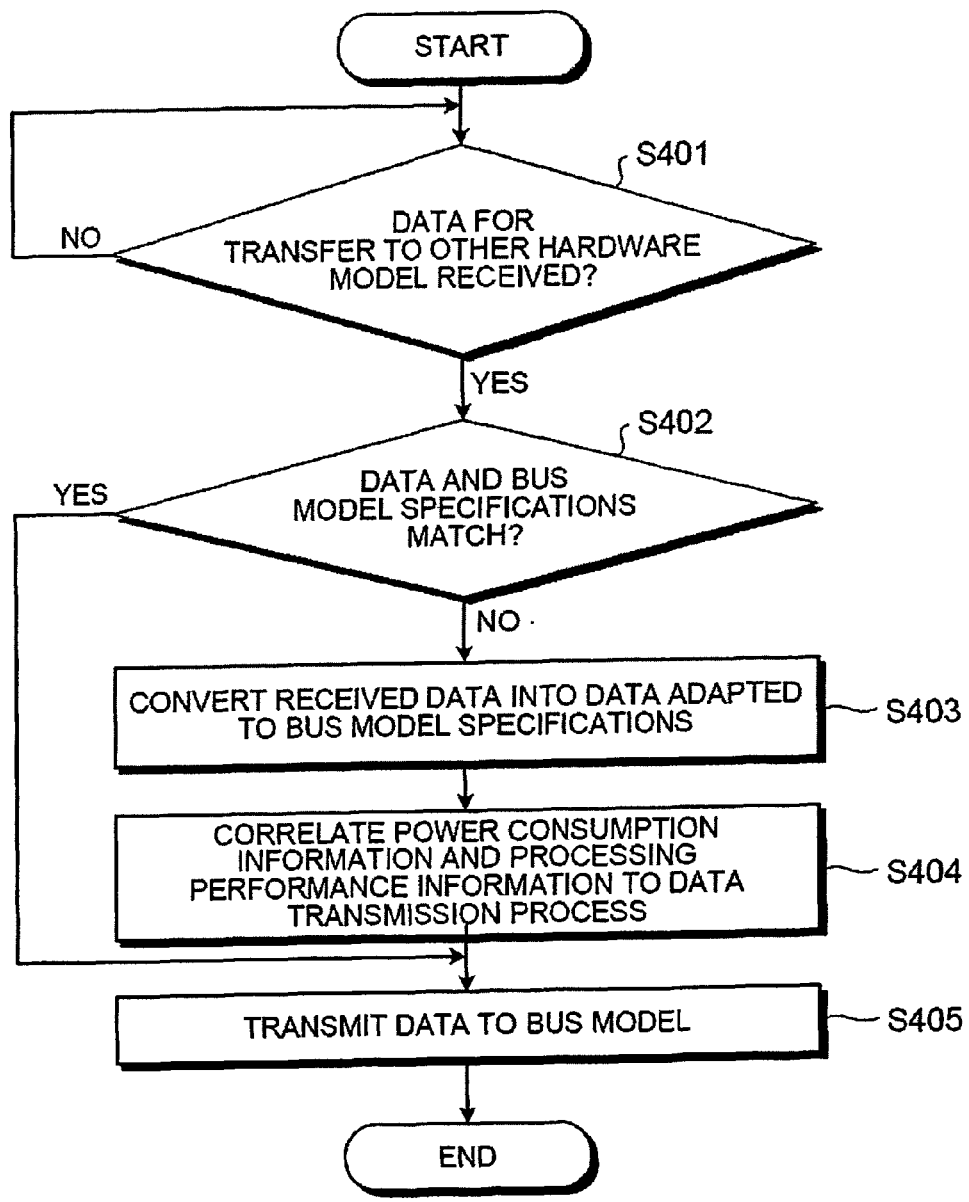
FIG. 7 illustrates a procedure of transmitting data to a hardware model with differing specifications.

FIG. 7 illustrates the procedure of transmitting data to a hardware model with differing specifications. In the flowchart of FIG. 7, firstly, the reception module 301 determines whether or not it has received data from a hardware model to be transmitted to another hardware model with differing specifications in the system model 120 (operation S401). As heretofore described, as appropriate data are transmitted to the bus model 121 whether the hardware model which is the transmission destination is of the specifications 1 or specifications 2, the specifications of the other hardware model on the reception side are not an issue.

In operation S401, the reception module 301 waits until receiving data to be transmitted to another hardware model (the "No" loop of operation S401) and, on receiving data to be transmitted (operation S401:Yes), determines whether or not the specifications of the received data and the specifications of the bus model match (operation S402).

If it is determined in operation S402 that the specifications of the received data and the specifications of the bus model 121 match (operation S402:Yes), as the received data are data based on the specifications 1, the transmission module 303 outputs the received data as they are to the bus model 121 (operation S405), and finishes the series of processes. For example, in the event that the reception module 301 receives data output from a hardware model with the specifications 1, the heretofore described kind of process is carried out.

Meanwhile, if it is determined in operation S402 that the specifications of the received data and the specifications of the bus model 121 do not match (operation S402:No), The received data are converted by the conversion module 302 into data adapted to the specifications of the bus model 121 (operation S403). Furthermore, power consumption information and processing performance information preset by the power consumption correlation module 304 and processing performance correlation module 306 are correlated to a data transmission process (corresponding to the process of operation S405, to be described hereafter) (operation S404). The order of operations S403 and S404 is not an issue.

On the data conversion process of operation S403 and correlation process of operation S404 finishing, lastly, the transmission module 303 outputs the data after conversion to the bus model 121 (operation S405), and finishes the series of processes. For example, in the event that the reception module 301 receives data output from a hardware model with the specifications 2, the heretofore described kind of process is carried out.

As heretofore described, with the information processing apparatus 100, when carrying out a simulation with the system model 120, data output from a hardware model with differing specifications are converted so as to be adapted to the specifications of the system model 120. That is, even in the event that hardware models of differing specifications may be included in the system model 120, it is possible to execute a proper simulation without causing a breakdown.

As a specific implementation example, a description will be given of a case in which bus specifications of a verification subject system, which has a configuration of a CPU, a memory, and a module A, are changed from AHB to AXI. Hereafter, a system with a bus for which an AHB is applied is taken to be an "existing system", and a system with a bus for which an AXI is applied an "updated system". Also, the description will be given hereafter taking it that, of the hardware in the systems, only the module A is not adapted to the AXI.

Figure 8:
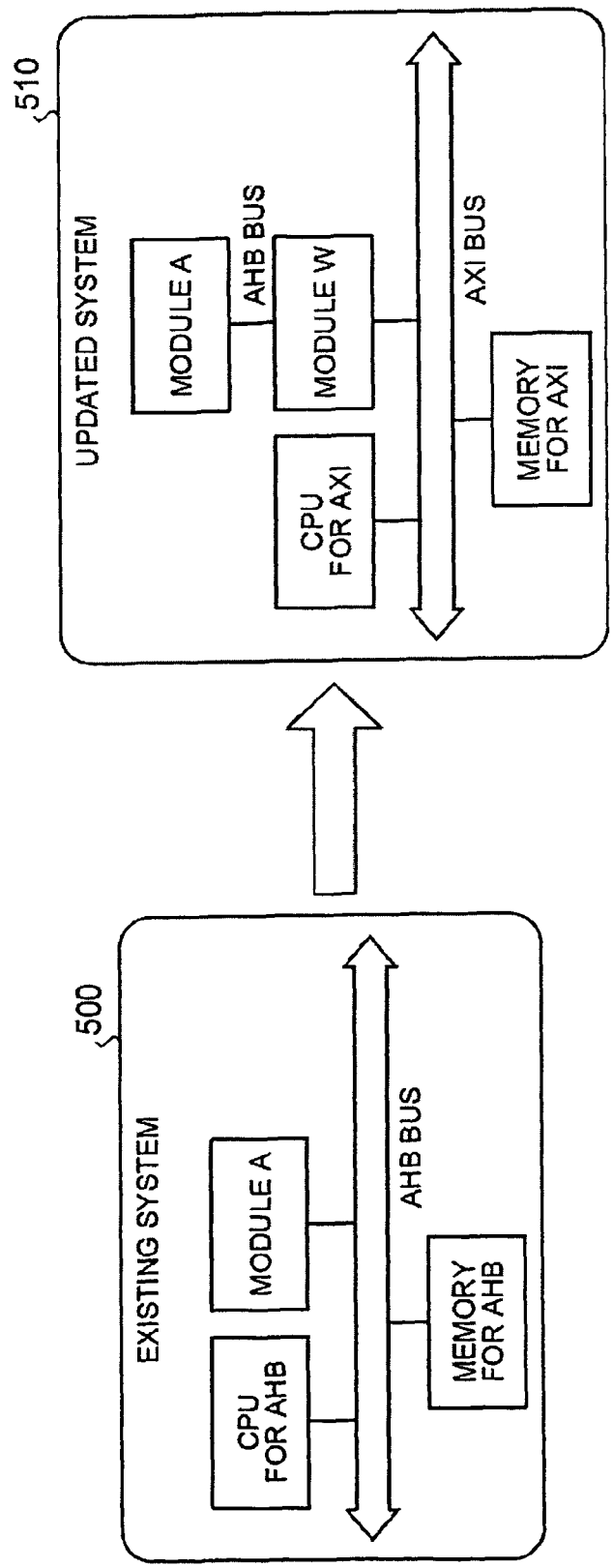
FIG. 8 illustrates an exemplary of a change of a system model by the verification support process.

FIG. 8 illustrates an exemplary of a change of the system model by the verification support process. As in FIG. 8, in the existing system 500, the CPU, memory, and module A are connected to the same AHB bus. The CPU, memory, and module A configuring the existing system 500 are configured with implementation information adapted to the same AHB specifications as the AHB bus.

Subsequently, a design change occurring, the updated system 510, in which the bus specifications are changed to AXI while retaining the same hardware structure as the existing system 500, becomes a new verification subject system. Consequently, the power consumption and processing performance have to be estimated by executing a simulation of the updated system 510. At this time, of the hardware configuring the updated system 510, implementation information adapted to the AXI is prepared for the CPU and memory. Then, the module A is configured with implementation information adapted to the AHB, in the same way as in the existing system 500.

Figure 9:
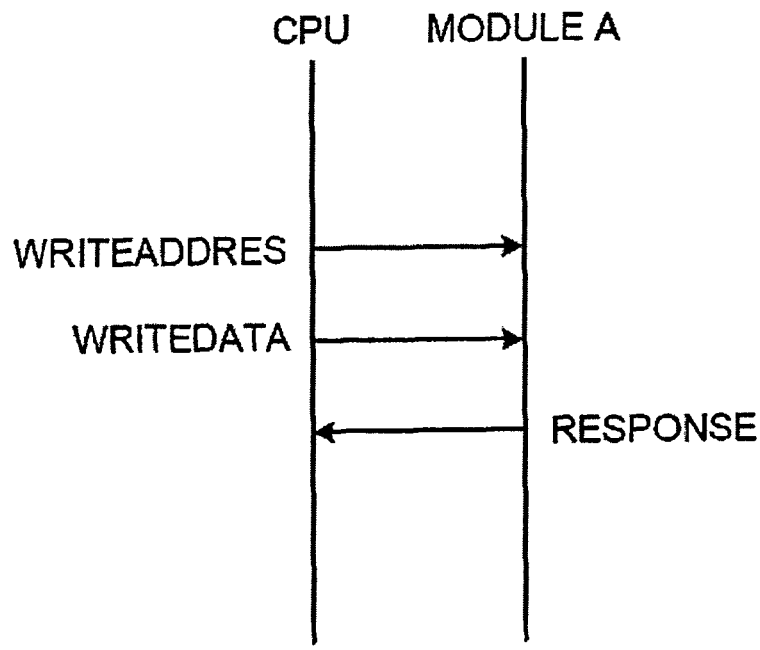
FIG. 9 illustrates an operation of a module A in a system.

FIG. 9 illustrates an operation of the module A in the existing system. The module A is configured with the implementation information of the AHB specifications. Consequently, as in FIG. 9, an access ("WriteAddress"/"WriteData") from the CPU is received, and on the "WriteData" process, which is an actual data writing process, finishing, "Response" is transmitted to the CPU as a response signal. Although the heretofore described kind of module A operation is a proper operation suited to the AHB specifications, "Response" being insufficient as a response signal in the updated system 510 with the AXI specifications, as has been described as a heretofore known problem using FIG. 2, the operation of the whole of the updated system 510 becomes bogged down.

Figure 10:
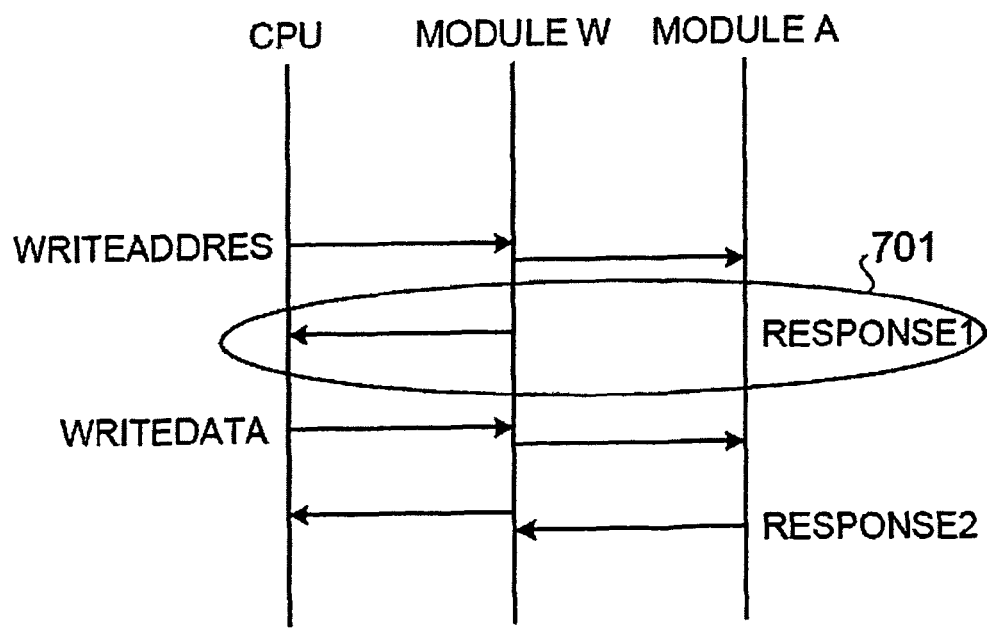
FIG. 10 illustrates an operation of a module A in an updated system.

In order to cause a proper response signal to be output from the module A, it is necessary to add the modules described in FIG. 6. A module W, which executes processes corresponding to those of the modules described in FIG. 6, may be added between the module A and AXI bus, as in FIG. 8. FIG. 10 illustrates an operation of the module A in the updated system. As in FIG. 10, with the module W added to the updated system 510, a response signal 701 ("Response 1") adapted to the AXI specifications is output in accordance with an output of a module A response signal ("Response 2").

On an access of the module A by the CPU being carried out, "Response 1" and "Response 2" are transmitted as response signals. These response signals are actually transmitted individually from the module A and module W. However, as the module A is set as the transmission source in the response signals themselves, the CPU may operate on the assumption that it has received a response signal transmitted from the module A with the AXI specifications.

Not being limited to the sequence example of FIG. 10, in the event that any data are output from the module A, a conversion process may be performed by the module W. Consequently, an operation in accordance with the AXI specifications being carried out by both the CPU and memory, it becomes possible to estimate the power consumption and processing performance by a simulation of the updated system 510.

Figure 11:
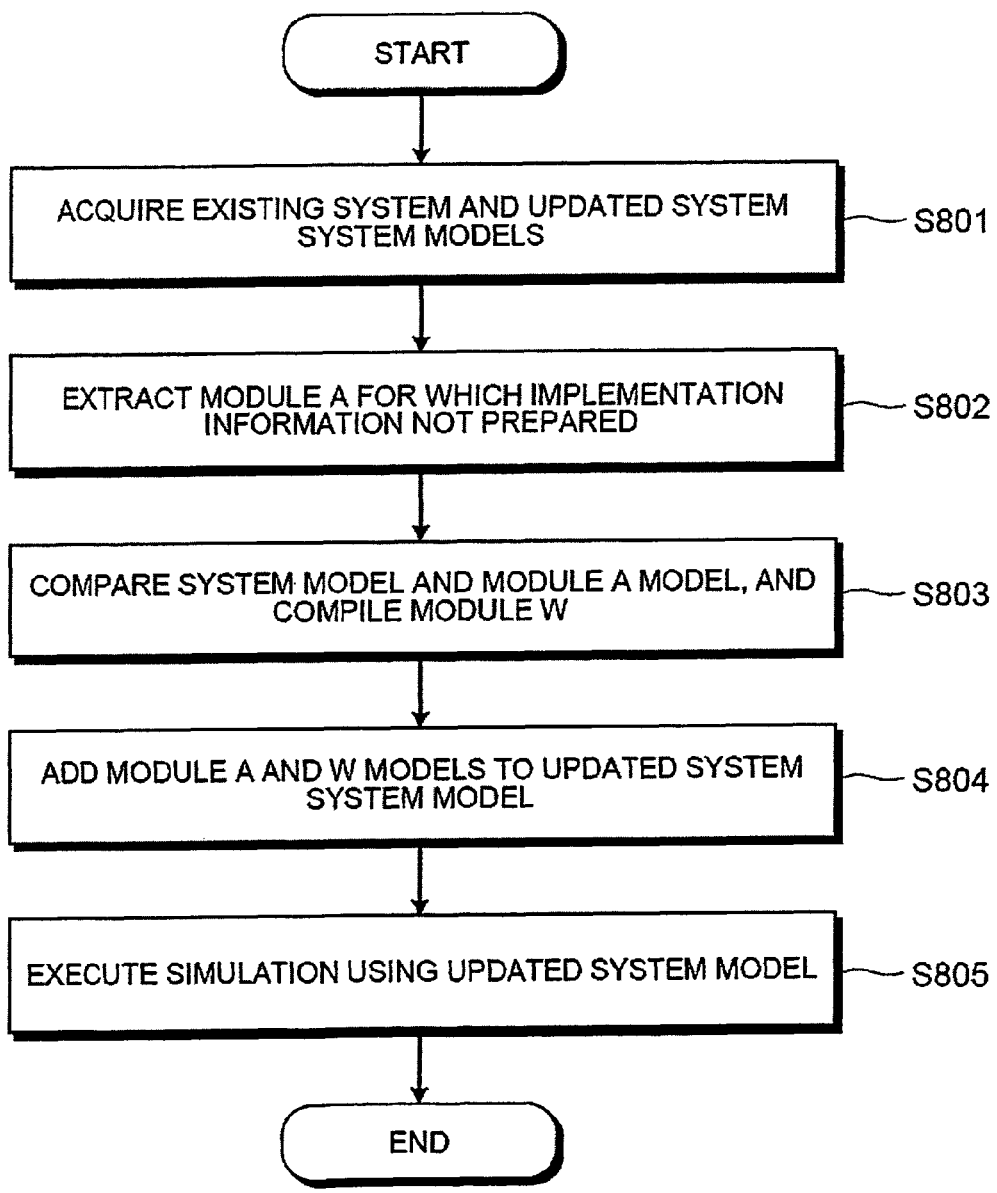
FIG. 11 illustrates an execution procedure of a simulation with the updated system.

FIG. 11 illustrates the execution procedure of a simulation with the updated system. In FIG. 11, the information processing apparatus 100 acquires the system models of the existing system 500 and updated system 510 (operation S801). The system model is information for virtually reproducing the hardware with the information processing apparatus 100, connection information of the hardware configuring the system, implementation information (for example, an RTL description or TL description) representing an implementation of each item of hardware, specifications, and the like, are included.

In the information processing apparatus 100, the configurations of the existing system 500 and updated system 510 acquired in operation S801 are compared, and the module A in the updated system 510, for which no implementation information is prepared, may be extracted (operation S802). In the information processing apparatus 100, on the module A being extracted, the system model of the updated system 510 and the model of the module A (the AHB implementation information) are compared, and the module W is compiled (operation S803).

As an exemplary method for compiling the module W in operation S803, the module W is compiled by compiling a wrapper model which processes output data from the module A. A wrapper model is a program for turning the return value of one program over to another program.

On the module W being compiled with operation S803, the information processing apparatus 100 next may add the models of the modules A and W to the system model of the updated system 510 (operation S804), executes a simulation using the system model of the updated system 510 after each module may be added (operation S805), and finishes the series of processes.

Although, in the embodiment, RTL described implementation information is provided, there are also cases in which a hardware description with a differing level of abstraction, such as a TL description, is provided as well. In this kind of case, a simulation with the same identical updated system 510 is possible by providing a plurality of simulators corresponding to each description level, and causing the plurality of simulators to operate in concert.

Figure 12:
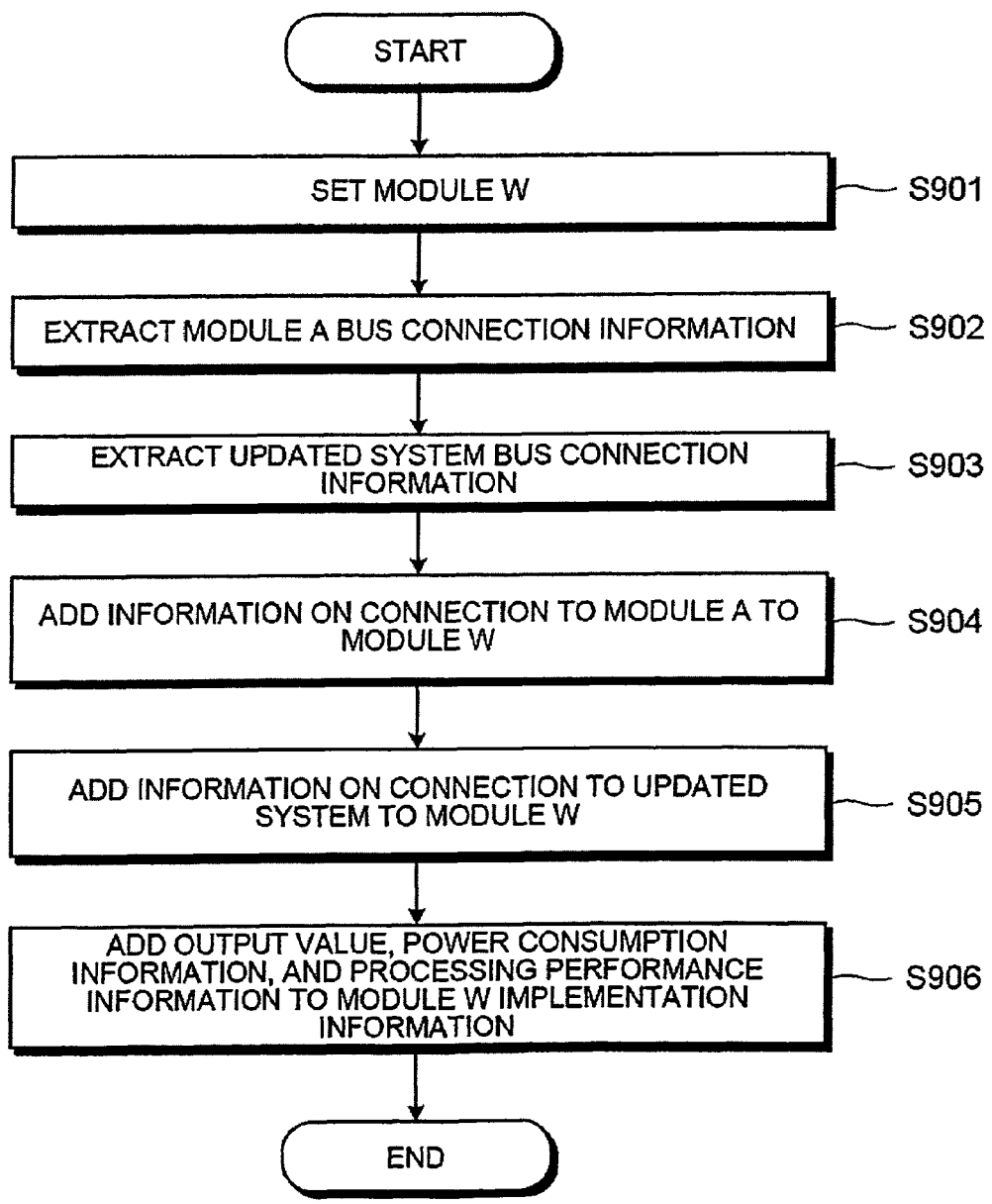
FIG. 12 illustrates a procedure of compiling a wrapper model to be added to the updated system.

FIG. 12 illustrates the procedure of compiling a wrapper model to be added to the updated system. In the flowchart of FIG. 12, the information processing apparatus 100, firstly, sets the module W (operation S901). Details of a process in the module W not being set at the operation S901 stage, the condition is as though an empty box has been prepared.

The information processing apparatus 100 extracts module A bus connection information (operation S902). In order to extract the module A bus connection information in operation S902, the information processing apparatus 100, firstly, extracts port information from the module A implementation information. Although an RTL description, a TL description, and the like, are assumed in the hardware description provided as implementation information, a description will be given assuming that RTL described implementation information is provided.

Figure 13:
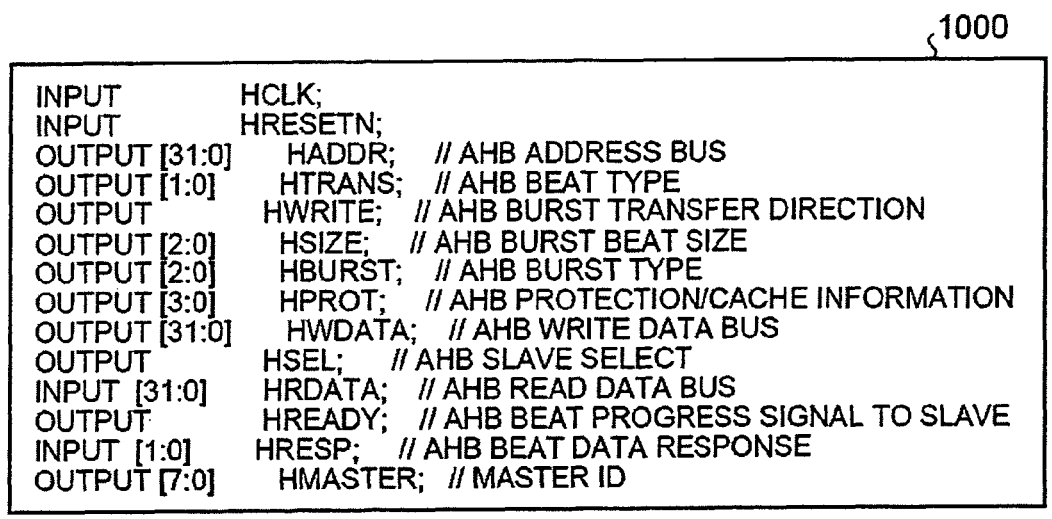
FIG. 13 illustrates exemplary AHB bus port information.

FIG. 13 illustrates exemplary AHB bus port information. In the event that a transmission and reception of data occurs in the module A, normally, a response is made to each port set in accordance with the AHB specifications, as in port information 1000 (for example, the operation of the module A of FIG. 9).

Furthermore, the information processing apparatus 100 extracts transaction information from the module A specifications. Transaction information may be defined as s information in which is set behavior of the module A when accesses of the module A are carried out in accordance with various kinds of operation. Consequently, in operation S902, transaction information according to the access of the module A may be extracted from among the items of transaction information defined as below. As actual transaction information, various kinds of specification description for executing the set behavior are written in various kinds of language, but in order to make the behavior details easy to understand, they are described in natural language.

"AHB Transaction Definition"
In the case of write(address, data)
1) Submit address to HADDR.
   Submit data to HWDATA.
   Submit 1 (write) to HWRITE.
   Submit 0 (single transfer) to HBURST. Submit optional value for other output signals.
2) Wait until HRESP signal outputs 1.
read (address)
1) Submit address to HADDR.
   Submit 0 (read) to HWRITE.
   Submit 0 (single transfer) to HBURST.
   Submit optional value for other output signals.
2) Wait until HRESP signal outputs 1.
3) Take value of HRDATA as received data.
init( )
1) Make HRESETn signal 0.
2) Make HRESETn signal 1.

On the module A bus connection information being extracted with operation S902, the information processing apparatus 100 extracts updated system 510 bus connection information (operation S903). In the case of extracting the updated system 510 bus connection information too, the information processing apparatus 100, firstly, extracts port information from the implementation information.

FIG. 14 illustrates exemplary AXI bus port information. In the event that a transmission and reception of data occurs in the modules of the updated system 510, a response is made to each port set in accordance with the AXI specifications, as in port information 1100 (for example, the operation of the module A of FIG. 10).

Then, the information processing apparatus 100 extracts transaction information from the updated system 510 specifications. Consequently, in operation S903, transaction information according to the access of the modules may be extracted from among the items of transaction information defined as above.

"AXI Transaction Definition"
write(address, data)
1) Submit address to AWADDR.
   Submit data to WDATA.
   Submit 0 for AWID, AWLEN, WID, and WVALID.
   Submit 1 to AWVALID and BREADY.
   Submit optional value for other output signals.
2) Wait until AWRESP signal receives 1.
3) Submit data to WDATA. Submit 1 to WVALID.
   Wait until BID and WRESP receive 0, and BVALID receives 1.
read (address)
1) Submit address to ARADDR.
   Submit 0 to ARID and ARLEN.
   Submit 1 to RVALID.
   Submit optional value for other output signals.
2) Wait until RREADY receives 0.
3) Take value of RDATA as received data.
init( )
1) Wait until ARESETn signal receives 0.
2) Wait until ARESETn signal receives 1.

interrupt( )
1) Submit 0 to AWREADY, WREADY, BRESP, ARREADY, and RREADY.

Submit optional value for other output signals.

The information processing apparatus 100 may add information on the connection to the module A to the module W (operation S904). That is, the connection information extracted in operation S902 may be added to the module W newly set in operation S901. As illustrated in FIG. 8, in the updated system 510, the module W is connected between the bus and module A. Consequently, in the operation S904, by interchanging the inputs and outputs of the port information 1000, port information representing the connection to the module A may be added to the empty module W set in operation S901.

The information processing apparatus 100 may add information on the connection to the updated system 510 to the module W (operation S905). The information on the connection to the updated system 510 is information representing the connection between the module W and the bus. Consequently, in the operation S905, by interchanging the inputs and outputs of the port information 1100, port information representing the connection to the bus may be added to the module W.

With the information processing apparatus 100 adding an output value, power consumption information, and processing performance information to the implementation information of the module W (operation S906), a wrapper which realizes the module W is compiled, and the information processing apparatus 100 finishes the series of processes. By adding an output value to the implementation information with operation S906, it is possible to secure an appropriate operation of the module A in the updated system 510. Also, the power consumption information and processing performance information are output as estimate values of an operation using the module A when carrying out a simulation of the updated system 510 with the information processing apparatus 100.

As there is no need to output a correct value for the output value as a result of an arithmetic processing by the module A, a preset value or a random value as the output value may be used. This is because the information processing apparatus 100 verifies the power consumption and processing performance when operating the updated system 510. That is, it may be sufficient that the updated system 510 operates smoothly in accordance with the given scenario, even though no accurate value is output as a result of a module A computation.

A description will be given of an estimate of power consumption and processing performance when executing a simulation of the updated system 510, utilizing the heretofore described kind of power consumption information and processing performance information added to the implementation information.

Figure 15:
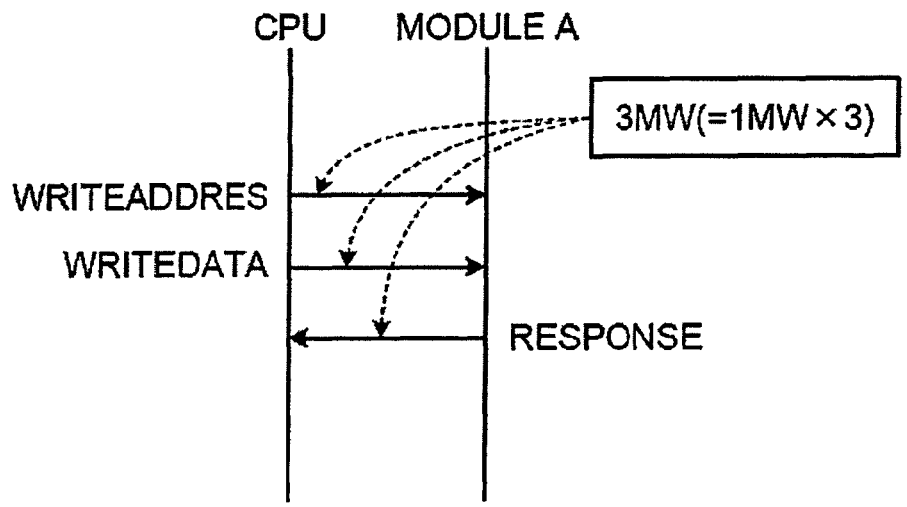
FIG. 15 illustrates a power consumption estimation process when executing a simulation.

FIG. 15 illustrates a power consumption estimation process when executing a simulation. FIG. 15 represents an estimate in the case of operating the module A in the system with the AHB specifications. For the power consumption, it is sufficient to detect an access of the module A ("WriteAddress"/"WriteData"), and an output of a response signal ("Response") responding to the access, and add together the preset power consumptions. as the power produced in one process is set at 1 mW, a power consumption of 3 mW is provided as the estimate value.

It may be necessary to carry out an estimate for an operation of the module A in the updated system 510. In the case of the updated system 510, an estimate value is provided by making a correction to the estimate illustrated in FIG. 15.

Figure 16:
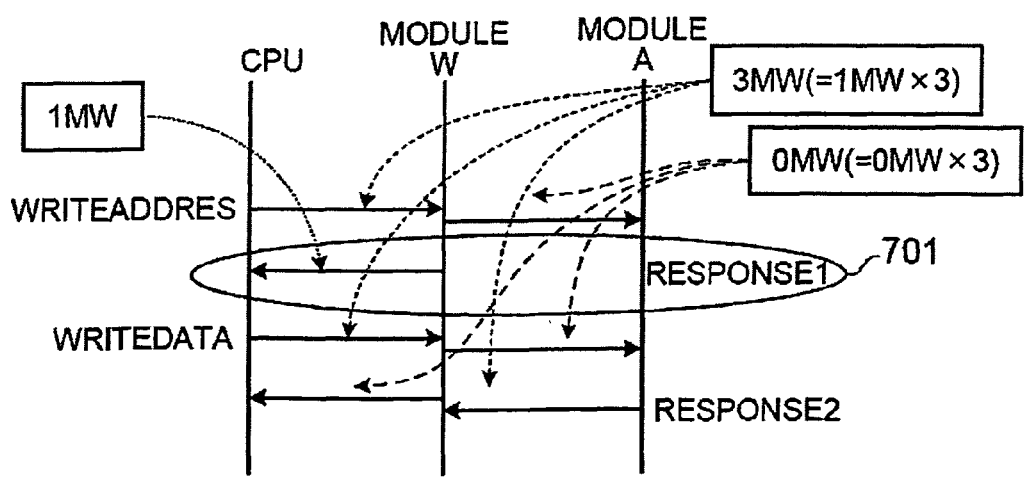
FIG. 16 illustrates an exemplary of correcting the power consumption estimation process when executing a simulation.

FIG. 16 illustrates an exemplary of correcting a power consumption value when executing a simulation. FIG. 16 illustrates a process of the module A transmitting a response signal in response to an access from the CPU, in the same way as in FIG. 15, in the updated system 510 with the AXI specifications.

An access from the CPU ("WriteAddress"/"WriteData"), and a response signal ("Response") responding to the access, are detected. At this time, as accesses from the module W of the CPU and module A (broad arrows) are accesses which are not carried out in the actual apparatus, basically, a power consumption of 0 mW is set in advance.

At this time, as an exception, a response signal ("Response 1") newly arising due to the data conversion process by the module W is detected as an access actually occurring in the updated system 510. The preset power consumption of 1 mW may be added for the detected response signal. As a result, 1 mW being added as a correction value for the estimate value of the response signal ("Response 1"), a power consumption of 4 mW is provided as the estimate value. With regard to the processing performance too, an estimate value is provided in the same way by processing times preset for the detected accesses being added together.

Figure 17:
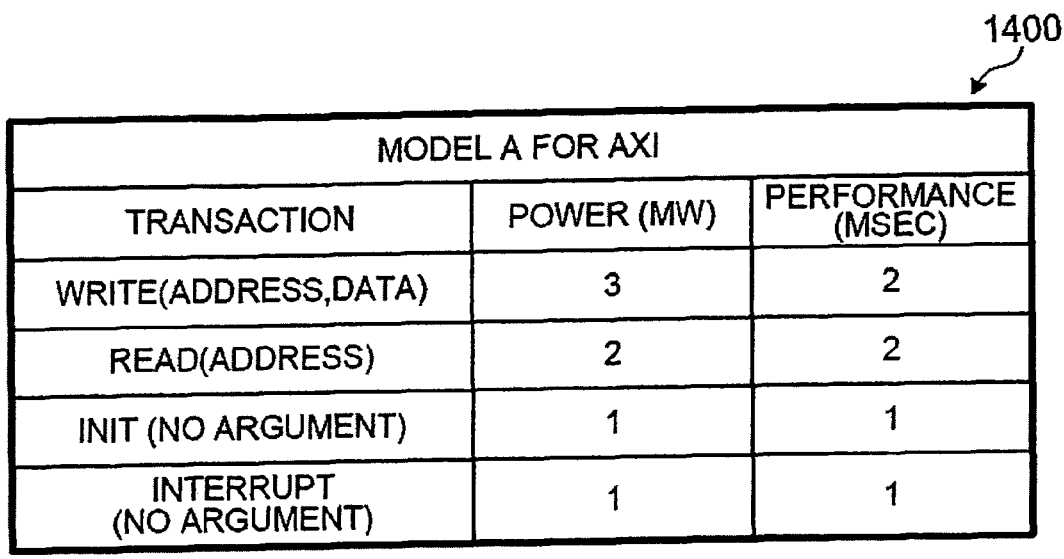
FIG. 17 illustrates an estimate example of a hardware model A with AXI specifications.

T a description will be given hereafter of a specific estimate procedure. FIG. 17 illustrates an estimate example of a hardware model A with the AXI specifications. In the event that, provisionally, a hardware model of the module A with the AXI specifications (the hardware model A) is prepared in the updated system 510, it is taken that estimate values as in the data table 1400 are provided.

With the information processing apparatus 100, no hardware model of the module A with the AXI specifications is prepared. T A process which calculates an estimate value of the module A with the AXI specifications is carried out utilizing a hardware model already prepared. Then, it is taken that a hardware model of the module A with the AHB specifications (the hardware model A), and a hardware model of the module W with the AXI specifications (a hardware model W), are already prepared.

Figure 18:
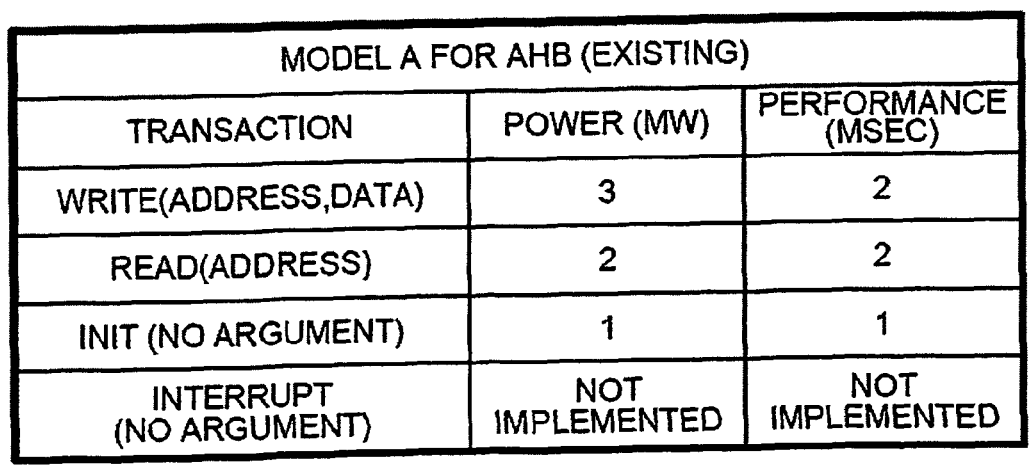
FIG. 18 illustrates an estimate example of a hardware model A with AHB specifications.
Figure 19:
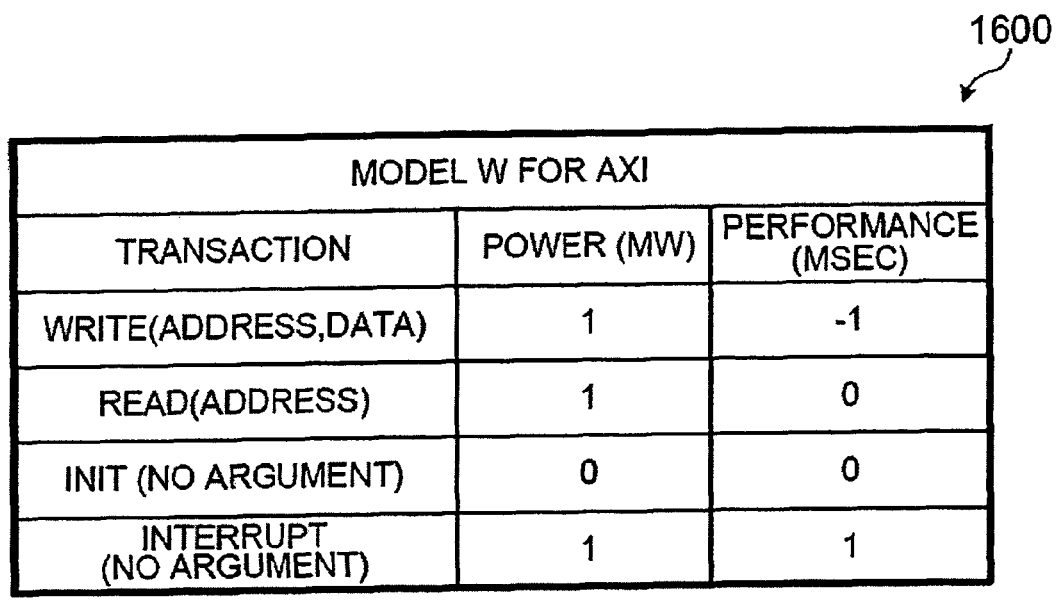
FIG. 19 illustrates an estimate example of a hardware model W with the AXI specifications.

FIG. 18 illustrates an estimate example of the hardware model A with the AHB specifications, while FIG. 19 illustrates an estimate example of the hardware model W with the AXI specifications. Power consumption information and processing performance information are added in operation S906 of FIG. 12, but the information added here is held as in the data tables 1500 and 1600.

Figure 20:
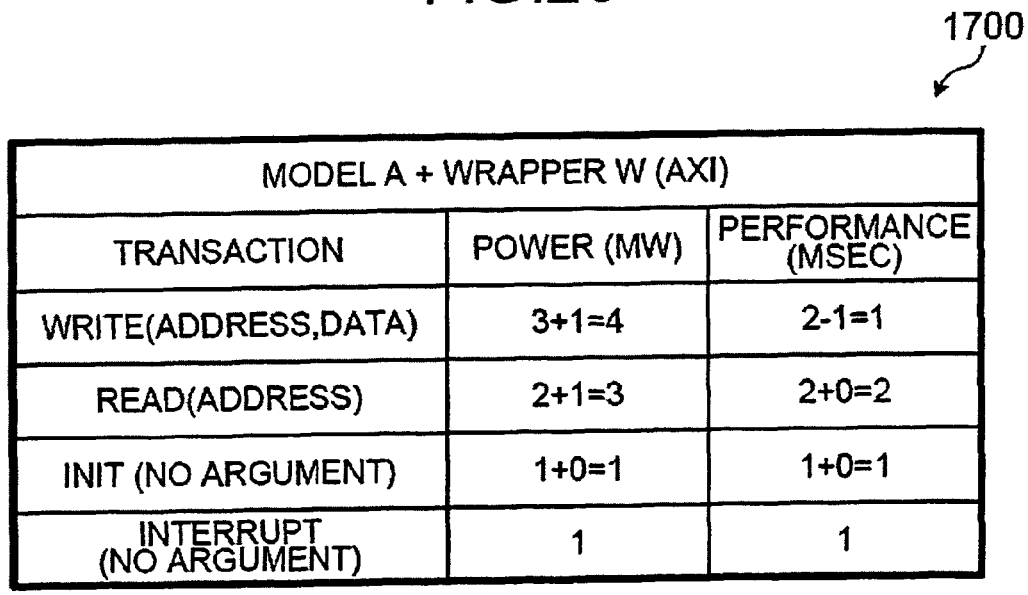
FIG. 20 illustrates an estimate example of the hardware model A with the AHB specifications into which the hardware model W is inserted.

Consequently, in the event that the module W may be added to the updated system 510, the estimate values of the hardware model A and hardware model W are combined. FIG. 20 illustrates an estimate example of the hardware model A with the AHB specifications into which the hardware model W is inserted. By adding together the estimate values of the data table 1500 and the estimate values of the data table 1600, as in the data table 1700, it is possible to obtain estimate values approximating the estimate values of the module A with the AXI specifications.

Although discrepancies may occur between the estimate values of the data table 1700 of FIG. 20 and the values of the data table 1400 of FIG. 17, by increasing the accuracy of the values when setting the power consumption information and processing performance information, it is possible to provide estimate values which more nearly approximate the values of the data table 1400.

According to a verification support process according to an embodiment, even in the case of a system in which is connected a hardware model differing from the specifications of the bus model, data transmitted from the hardware model with the differing specifications are automatically converted into data adapted to the specifications of the bus model.

That is, the data are transmitted to the bus model only after being converted. Consequently, even in the event of including hardware with specifications differing from those of other hardware, it is possible to execute a simulation of the whole system without waiting for a change in the hardware specifications. Because of this, even at an early stage of the system design, it is possible to estimate the power and performance when operating the whole of the system.

Also, with the verification support process, a configuration may uniquely accept data output from a module with optional specifications, that is, data for which it is not clear to which specifications the data are adapted. In this case, in the event that they are data of differing specifications, a conversion is carried out, while in the event that they are data with matching specifications, they are transmitted as they are to the bus. Consequently, even in the event that it is not possible to specify the specifications of each hardware model in the system, it is possible to appropriately convert only data of differing specifications, and execute an accurate simulation.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A non-transitory computer-readable recording medium storing a verification support program, that causes a computer to execute a simulation controlling a communication between a first hardware model in communication with a bus model and adapted to same first specifications as the bus model, and a second hardware model in communication with the bus model and adapted to second specifications differing from those of the bus model, by:

receiving data based on the second specifications from the second hardware model;

converting the data received based upon the second specifications into data adapted to the first specifications; and transmitting the converted data including information on power consumption correlation, which correlates a transmission process of the data and a preset power consumption value, to the first hardware model as a transmission destination via the bus model for retrieval when executing the simulation.

2. The non-transitory computer-readable recording medium according to claim 1, wherein the receiving determines whether optional specifications match the first specifications in the event of receiving from a hardware model with optional specifications data based on the optional specifications, and wherein the converting converts the data received by the receiving into data adapted to the first specifications in the event that it is determined by the receiving that the optional specifications do not match the first specifications.

3. The non-transitory computer-readable recording medium according to claim 2, wherein the converting converts the data received into data adapted to the first specifications in accordance with transaction definitions given in advance as the first specifications.

4. The non-transitory computer-readable recording medium according to claim 3, the program further causing the computer to execute:

correlating a processing performance which correlates a transmission process of the data and a preset processing time as processing performance information when the transmitting transmits the data converted by the conversion process to the first hardware model which is the transmission destination, and retrieving the processing performance information correlated when the simulation being executed.

5. The non-transitory computer-readable recording medium according to claim 2, the program further causing the computer to execute:

correlating a processing performance which correlates a transmission process of the data and a preset processing time as processing performance information when the transmitting transmits the data converted by the conversion process to the first hardware model which is the transmission destination, and retrieving the processing performance information correlated when the simulation being executed.

6. The non-transitory computer-readable recording medium according to claim 1, wherein the converting converts the data received into data adapted to the first specifications in accordance with transaction definitions given in advance as the first specifications.

7. The non-transitory computer-readable recording medium according to claim 6, the program further causing the computer to execute:

correlating a processing performance which correlates a transmission process of the data and a preset processing time as processing performance information when the transmitting transmits the data converted by the conversion process to the first hardware model which is the transmission destination, and retrieving the processing performance information correlated when the simulation being executed.

8. The non-transitory computer-readable recording medium according to claim 1, the program further causing the computer to execute:

correlating a processing performance which correlates a transmission process of the data and a preset processing time as processing performance information when the transmitting transmits the data converted to the first hardware model which is the transmission destination, and retrieving the processing performance information correlated when the simulation being executed.

9. A verification support apparatus executing a simulation controlling a communication between a first hardware model in communication with a bus model and adapted to same first specifications as the bus model, and a second hardware model in communication with the bus model and adapted to second specifications differing from those of the bus model, the apparatus comprising:

a reception unit that receives data based on the second specifications from the second hardware model;

a conversion unit that converts the data received based upon the second specifications into data adapted to the first specifications; and a transmission unit that transmits the converted data including information on power consumption correlation, which correlates a transmission process of the data and a preset power consumption value, via the bus model, to the first hardware model as a transmission destination for retrieval when executing the simulation.

10. The verification support apparatus according to claim 9, wherein the transmitting further includes transmission of correlated processing performance information which correlates a transmission process of the data and a preset processing time.

11. A verification support method executed by a computer executing a simulation controlling a communication between a first hardware model in communication with a bus model and adapted to same first specifications as the bus model, and a second hardware model in communication with the bus model and adapted to second specifications differing from those of the bus model, the method comprising:

receiving data based on the second specifications from the second hardware model;

converting, by the computer, the data received based upon the second specifications into data adapted to the first specifications; and transmitting the converted data including information on power consumption correlation, which correlates a transmission process of the data and a preset power consumption value, to the first hardware model as a transmission destination via the bus model for retrieval when executing the simulation.

12. The verification support method according to claim 11, wherein the transmitting further includes transmission of correlated processing performance information which correlates a transmission process of the data and a preset processing time.

* * * * *